US012802924B2

(12) United States Patent
Zheng et al.

(10) Patent No.: US 12,802,924 B2
(45) Date of Patent: Nov. 17, 2026

(54) ELECTRON MICROSCOPE DETECTOR AND RELATED METHODS

(71) Applicant: Taiwan Semiconductor Manufacturing Company, Ltd., Hsinchu (TW)

(72) Inventors: Jian-Ming Zheng, Pingtung County (TW); Meng-Han Hung, Tainan City (TW); Po-Chien Huang, Tainan City (TW); Chung-Hung Lin, Tainan City (TW); Chih-Wei Wen, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 331 days.

(21) Appl. No.: 18/421,373

(22) Filed: Jan. 24, 2024

(65) Prior Publication Data

US 2025/0239431 A1 Jul. 24, 2025

(51) Int. Cl.

*H01J 37/28* (2006.01)
*H01J 37/22* (2006.01)
*H01J 37/244* (2006.01)

(52) U.S. Cl.

CPC ............ *H01J 37/28* (2013.01); *H01J 37/222* (2013.01); *H01J 37/244* (2013.01);

(Continued)

(58) Field of Classification Search

CPC .. H01J 37/00; H01J 37/02; H01J 37/26; H01J 37/28; H01J 37/222; H01J 37/244;

(Continued)

(56) References Cited

U.S. PATENT DOCUMENTS

| | | | | |
|---|---|---|---|---|
| 4,897,545 A * | 1/1990 | Danilatos | ................ | H01J 37/28 250/397 |
| 8,796,666 B1 | 8/2014 | Huang | | |

(Continued)

FOREIGN PATENT DOCUMENTS

| | | | |
|---|---|---|---|
| TW | I622078 | B | 4/2018 |
| TW | 202143282 | A | 11/2021 |
| TW | I825193 | B | 12/2023 |

OTHER PUBLICATIONS

Hak, Cik Rohaida Che et al., "Field Emission Scanning Electron Microscope (FE-SEM) Facility in Bti", Materials Technology Group, Industrial Technology Division, Agensi Nuklear Malaysia; Radiation Processing Division, Agensi Nuklear Malaysia, 6pp.

(Continued)

*Primary Examiner* — Jason L McCormack

(74) *Attorney, Agent, or Firm* — HAYNES AND BOONE, LLP

(57) ABSTRACT

Embodiments of the present disclosure include a scanning electron microscope (SEM) having an electron gun configured to generate an electron beam that is directed along an axis through a column of the SEM towards a sample stage. In some embodiments, the SEM includes a first backscattered electron (BSE) detector mounted along the axis. In some examples, the SEM further includes a second BSE detector mounted off the axis, where the second BSE detector wraps around a bottom portion of the column. The second BSE detector, in some examples, includes a plurality of blades having either a flat shape or an arc shape in a side view. Additionally, in some embodiments, the plurality of blades are arranged in a circular configuration in a top view.

20 Claims, 9 Drawing Sheets

(52) U.S. Cl.
CPC .................. *H01J 2237/2445* (2013.01); *H01J 2237/24475* (2013.01); *H01J 2237/2805* (2013.01)

(58) Field of Classification Search
CPC ..... H01J 2237/2445; H01J 2237/24475; H01J 2237/2805; H01J 2237/2814
USPC .......................................... 250/306, 307, 311
See application file for complete search history.

(56) References Cited

U.S. PATENT DOCUMENTS

| | | | | |
|---|---|---|---|---|
| 8,837,810 | B2 | 9/2014 | Chen | |
| 9,093,530 | B2 | 7/2015 | Huang | |
| 9,134,633 | B2 | 9/2015 | Lin | |
| 9,230,867 | B2 | 1/2016 | Cheng | |
| 9,304,403 | B2 | 4/2016 | Lin | |
| 9,404,743 | B2 | 8/2016 | Chiu | |
| 9,548,303 | B2 | 1/2017 | Lee | |
| 9,823,585 | B2 | 11/2017 | Shih | |
| 9,841,687 | B2 | 12/2017 | Lee et al. | |
| 2004/0084629 | A1 | 5/2004 | Preikszas | |
| 2004/0173747 | A1* | 9/2004 | Dean | H01J 37/301<br>250/310 |
| 2005/0087514 | A1 | 4/2005 | Koops | |
| 2021/0319977 | A1* | 10/2021 | Liu | H01J 37/244 |
| 2022/0102121 | A1* | 3/2022 | Potocek | H01J 37/32926 |
| 2023/0104558 | A1* | 4/2023 | Jiang | H01J 37/1471<br>250/310 |

OTHER PUBLICATIONS

CID, Aranzazu Garitagoitia et al., Application of the EsB Detector in the Low Voltage Scanning Electron Microscopy (LVSEM); Sep. 2015, 4pp.
Waiblinger, M. et al., “E-beam induced EUV photomask repair—a perfect match”, BACUS News, May 2010, vol. 26, Issue 5, 9pp.
Mignot, Christophe, “Color (and 3D) for Scanning Electron Microscopy”, Microscopy Today, vol. 26, Issue 3, Cambridge University Press, May 8, 2018, 15pp.
Liang, Ted et al., “Demonstration of Damage-Free Mask Repair Using Electron Beam-induced Processes”, Proceedings of SPIE—The International Society for Optical Engineering; Aug. 2004, 11pp.
Wang, Jianhua et al., “Etching characteristics of chromium thin films by an electron beam induced surface reaction”, Semicond. Sci. Technol. 18, (2003) pp. 199-205.
“Detection Principles based on GEMINI Technology”, Carl Zeiss SMT—Nano Technology Systems Division, Enabling the Nano-Age World, 6pp.
Park, Jin-Hyung et al., “Mask pattern recovery by level set method based inverse inspection technology (IIT) and its application on defect auto disposition”, Proc. of SPIE—The International Society for Optical Engineering; Oct. 2009; 12pp.
Kumagai, Kazuhiro et al., “Sharing of secondary electrons by in-lens and out-lens detector in low-voltage scanning electron microscope equipped with immersion lense”, Ultramicroscopy 109 (2009), 368-372.
Waiblinger, M et al., “Ebeam based mask repair as door opener for defect free EUV masks”, Proc. of SPIE vol. 8522 85221M-1, (2012), 11pp.

* cited by examiner 624A 624B 624C 624D 624E 624F 624G 624H

| Height(nm) | 0.2keV | 0.4keV | 0.6keV | 0.8keV | 1.0keV | 1.1keV | 1.2keV | 1.3keV | 1.4keV | 1.5keV |
|---|---|---|---|---|---|---|---|---|---|---|
| 3 | 16 | 17 | 54 | 79 | 114 | 117 | 117 | 117 | 120 | 137 |
| 5 | 14 | 17 | 37 | 48 | 80 | 93 | 102 | 98 | 107 | 110 |
| 8 | 14 | 16 | 24 | 25 | 62 | 71 | 76 | 91 | 96 | 107 |
| 10 | 14 | 15 | 17 | 17 | 21 | 23 | 24 | 24 | 27 | 51 |
| 13 | 7 | 7 | 9 | 12 | 13 | 15 | 20 | 24 | 26 | 40 |
| 16 | 6 | 7 | 8 | 9 | 10 | 11 | 14 | 15 | 16 | 21 |
| 17 | 3 | 4 | 4 | 5 | 6 | 6 | 7 | 8 | 9 | 10 |
| 20 | 5 | 5 | 5 | 3 | 3 | 2 | 3 | 3 | 4 | 6 |
| 22 | 1 | 2 | 2 | 2 | 2 | 1 | 2 | 1 | 1 | 0 |

622

ELECTRON MICROSCOPE DETECTOR AND RELATED METHODS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

In one example associated with lithographic patterning, a photomask (or mask) to be used in a lithography process has a circuit pattern defined thereon. The mask is used to transfer the circuit pattern to a substrate, for example, as part of a lithography system. For advanced technology nodes with highly-scaled feature sizes, the patterns on the mask need to be very accurate and the lithography patterning process is more sensitive to mask defects. In various cases, a mask is repaired to eliminate defects and is further checked to validate the repaired defects. However, available techniques for performing such validation are limited in their ability to provide accurate and reliable structural information.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
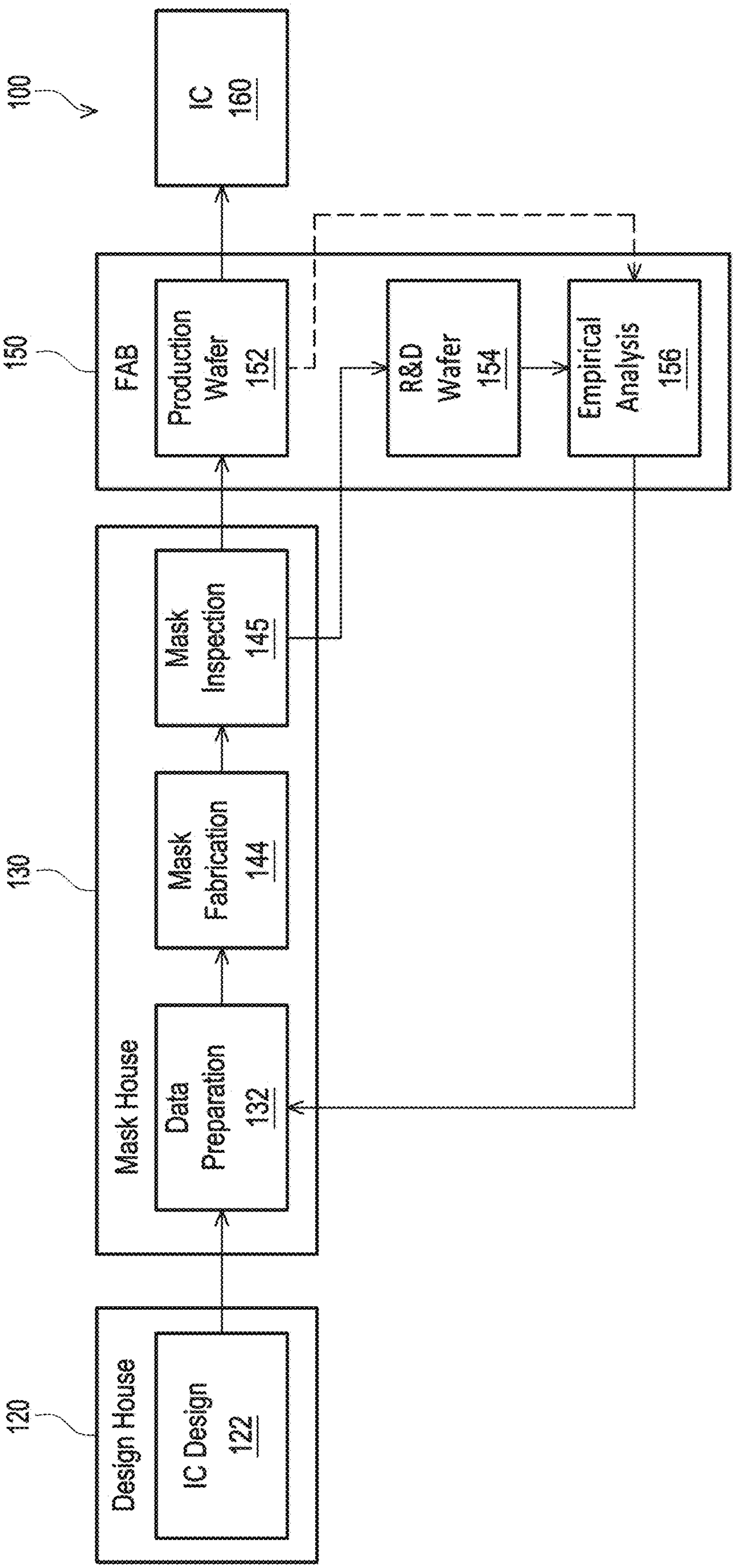
FIG. 1 provides a simplified block diagram of an embodiment of an integrated circuit (IC) manufacturing system and an IC manufacturing flow associated therewith, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

As noted above, photomask (mask) patterns need to be very accurate, and lithography patterning processes are more sensitive to mask defects for advanced technology nodes. In various cases, a mask is repaired to eliminate defects and is further checked to validate the repaired defects. As one example, when defects such as peeling occur during mask production, chromium (Cr) deposition (e.g., by electron beam induced deposition, EBID) may be performed to fill a missing pattern. Afterwards, the deposited Cr layer may be capped with a tetraethylorthosilicate (TEOS) capping layer, which may also be deposited via EBID, to safeguard the Cr from degradation. Available techniques for validation/inspection of such a repair are limited in their ability to provide accurate and reliable structural information. For instance, existing techniques that use a conventional scanning electron microscope (SEM) for the validation/inspection process are unable to provide detailed images of sidewalls of a sample, at least because such techniques are unable to capture a sidewall backscattered electron (BSE) image. As a result, it will be challenging to effectively locate and identify defects, particularly on sidewalls and after a repair has been performed and capped using a TEOS capping layer. Stated another way, accurate inspection of sample sidewall profiles using conventional BSE images is not possible. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include systems and methods for detecting a thickness and sidewall profile of a target sample. In some embodiments, an electron microscope (e.g., such as an SEM) with a 360-degree wraparound BSE detector is provided, which enables obtaining BSE images of a sidewall of the target sample, as described below. The disclosed BSE detector includes an out-lens detector that wraps around a bottom portion of an electron column of the electron microscope (e.g., adjacent to a bottom portion of the objective lens). In various embodiments, the out-lens detector includes a plurality of blades (that may have a flat shape or arc shape) strategically positioned at various angles, and which provide for capturing backscattered electrons from a full 360-degree range around the target sample. In various embodiments, an energy filtering grid may also be provided to allow for selection of a specified energy band of BSEs to be detected. Thus, the disclosed BSE detector may also be referred to as an energy selective backscatter (EsB) detector. The energy selective out-lens EsB detector grid (e.g., the energy filtering grid) can be used to improve the signal-to-noise ratio and enhance the contrast and resolution of the BSE imaging. The out-lens detector, in some examples, is further optically coupled to a photomultiplier tube (PMT), which may include a high quantum efficiency GaAs photocathode, for electron multiplication and conversion to an electric signal.

In some embodiments, a real-time adjustable electron high tension (EHT) voltage controller is provided, where variable EHT voltages can be used to generate BSE images with differing grayscale intensities, which in turn can be used to determine a film thickness (or height), as discussed herein. Distinguishing of different thicknesses across the varying grayscale intensities may, in some examples, be performed using a Gaussian Filter. Further, in some examples, the systems and methods disclosed herein include a 3D image algorithm (or overlay algorithm) that integrates a trained machine learning (ML) model with real-time BSE images. In an example, the 3D image algorithm may take the BSE images as input and use the trained ML model to estimate a surface thickness and sidewall profile, thereby providing a 3D image that can be used for reliable inspection of sample sidewalls. In various embodiments, the real-time BSE images may be taken across multiple EHT voltages, for example, using the real-time adjustable EHT voltage controller, in order to build up the 3D image.

The embodiments disclosed herein thus provide a variety of benefits and advantages. For example, the 360-degree wraparound BSE detector provides for higher precision and higher resolution images of a target sample, including a sidewall profile of the target sample. Further, utilization of the differing grayscale intensities provides an in-line gating check point for mask defects, even for those including a TEOS protected capping layer sidewall coverage. This ensures that defects are detected and corrected in real-time, reducing the need for manual inspection and improving the overall quality of the product. In addition, use of the disclosed system provides for faster detection and correction of defects, reducing the time and cost involved in manual inspection and correction. The system and methods disclosed herein also improve the efficiency of the manufacturing process by reducing the need for manual inspection and correction, and by providing higher precision images that enable faster and more accurate defect detection. It is noted that while various examples shown and described herein may be discussed in the context of photomask (mask) repair or inspection, embodiments of the present disclosure may similarly be used in other applications to achieve similar benefits. For instance, embodiments of the present disclosure may likewise be utilized as a mask in-line process monitor, for mask in-line structure verification, for mask optical proximity correction (OPC) design, or for mask critical dimension (CD) SEM measurement, among other applications. Additional embodiments and advantages will be evident to those skilled in the art upon reading the present disclosure.

To provide further understanding regarding the context of the present disclosure, FIG. 1 provides a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within or on a semiconductor substrate (e.g., such as a silicon wafer) and various material layers disposed on the semiconductor substrate. In various examples, the design house 120 implements a design procedure to form the IC design layout 122. The design procedure may include logic design, physical design, and/or place and route. The IC design layout 122 may be presented in one or more data files having information related to the geometrical patterns which are to be used for fabrication of the IC device 160. In some examples, the IC design layout 122 may be expressed in an Open Artwork System Interchange Standard (OASIS) file format, a GDSII file format, or DFII file format.

In some embodiments, the design house 120 may transmit the IC design layout 122 to the mask house 130, for example, via the network connection described above. The mask house 130 may then use the IC design layout 122 to manufacture one or more masks to be used for fabrication of the various layers of the IC device 160 according to the IC design layout 122. In various examples, the mask house 130 performs mask data preparation 132, where the IC design layout 122 is translated into a form that can be physically written by a mask writer, mask fabrication 144, where the design layout prepared by the mask data preparation 132 is modified to comply with a particular mask writer and/or mask manufacturer and is then fabricated, and mask inspection 145. In the example of FIG. 1, the mask data preparation 132 and mask fabrication 144 are illustrated as separate elements; however, in some embodiments, the mask data preparation 132 and mask fabrication 144 may be collectively referred to as mask data preparation.

By way of example, the mask data preparation 132 includes application of one or more resolution enhancement technologies (RETs) such as phase shift masks (PSMs), off-axis illumination (OAI), optical proximity correction (OPC), and inverse lithography technology (ILT) to compensate for potential lithography errors, such as those that can arise from diffraction, interference, or other process effects. In some embodiments, RETs (e.g., such as OPC or ILT) may be used to modify mask layouts to compensate for processing limitations used in the manufacture of an IC and which manifest themselves as process technology nodes are scaled down. Without RETs, simple scaling down of layout designs used at larger nodes often results in inaccurate or poorly shaped features. In various examples, OPC may be used to adjust line widths depending on the density of surrounding geometries, add "dog-bone" end-caps to the end of lines to prevent line end shortening, correct for electron beam (e-beam) proximity effects, or for other purposes. OPC may also be used to add sub-resolution assist features (SRAFs) such as scattering bars, serifs, and/or hammerheads to the IC design layout 122 such that, after a lithography process, a final pattern on a wafer is improved with enhanced resolution and precision. While some features of the mask data preparation 132 have been described, it will be understood that the above description has been simplified for purposes of clarity, and mask data preparation may include additional processes and/or features.

After mask data preparation 132 and during mask fabrication 144, a mask or a group of masks may be fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

At various stages during the mask fabrication process, as well as after mask fabrication, the mask or group of masks may be inspected (by mask inspection 145). In some embodiments, the mask inspection 145 is performed using an SEM with a 360-degree wraparound BSE detector, as described herein. If a defect is found during the inspection process, the defective mask or group of masks may be returned to mask fabrication 144 for further processing to repair the defect.

In some embodiments, the IC manufacturer 150, such as a semiconductor foundry, uses the mask (or masks) fabricated by the mask house 130 to transfer one or more mask patterns onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business. In various embodiments, the semiconductor wafer (i.e., the production wafer 152) within and/or upon which the IC device 160 is fabricated may include a silicon substrate or other substrate having material layers formed thereon. Moreover, the mask (or masks) may be used in a variety of processes. For example, the mask (or masks) may be used in an ion implantation process to form various doped regions in the semiconductor wafer, in an etching process to form various etching regions in the semiconductor wafer, and/or in other suitable processes.

As further shown in FIG. 1, and in some examples, the IC manufacturer 150 may use the mask (or masks) fabricated by the mask house 130 to transfer one or more mask patterns onto an R&D wafer 154. After processing of the R&D wafer 154, the R&D wafer 154 may then be transferred to a test lab (e.g., metrology lab or parametric test lab) for empirical analysis 156. In some embodiments, empirical data collected from the R&D wafer 154 may be transferred to the mask house 130, where the IC design layout 122 may be further modified (if needed) based on the empirical data. In some embodiments, the IC manufacturer 150 may use production wafers 152 or R&D wafers 154 to collect calibration data using empirical analysis 156, in accordance with various embodiments. In addition to wafer inspection, and in various examples, the empirical analysis 156 may include mask inspection using an SEM with a 360-degree wraparound BSE detector, as described herein. If a defect is found in a mask by the empirical analysis 156, the defective mask or group of masks may be returned to mask fabrication 144 for further processing to repair the defect. Alternatively, the IC manufacturer 150 may itself include a facility for mask repair.

Figure 2:
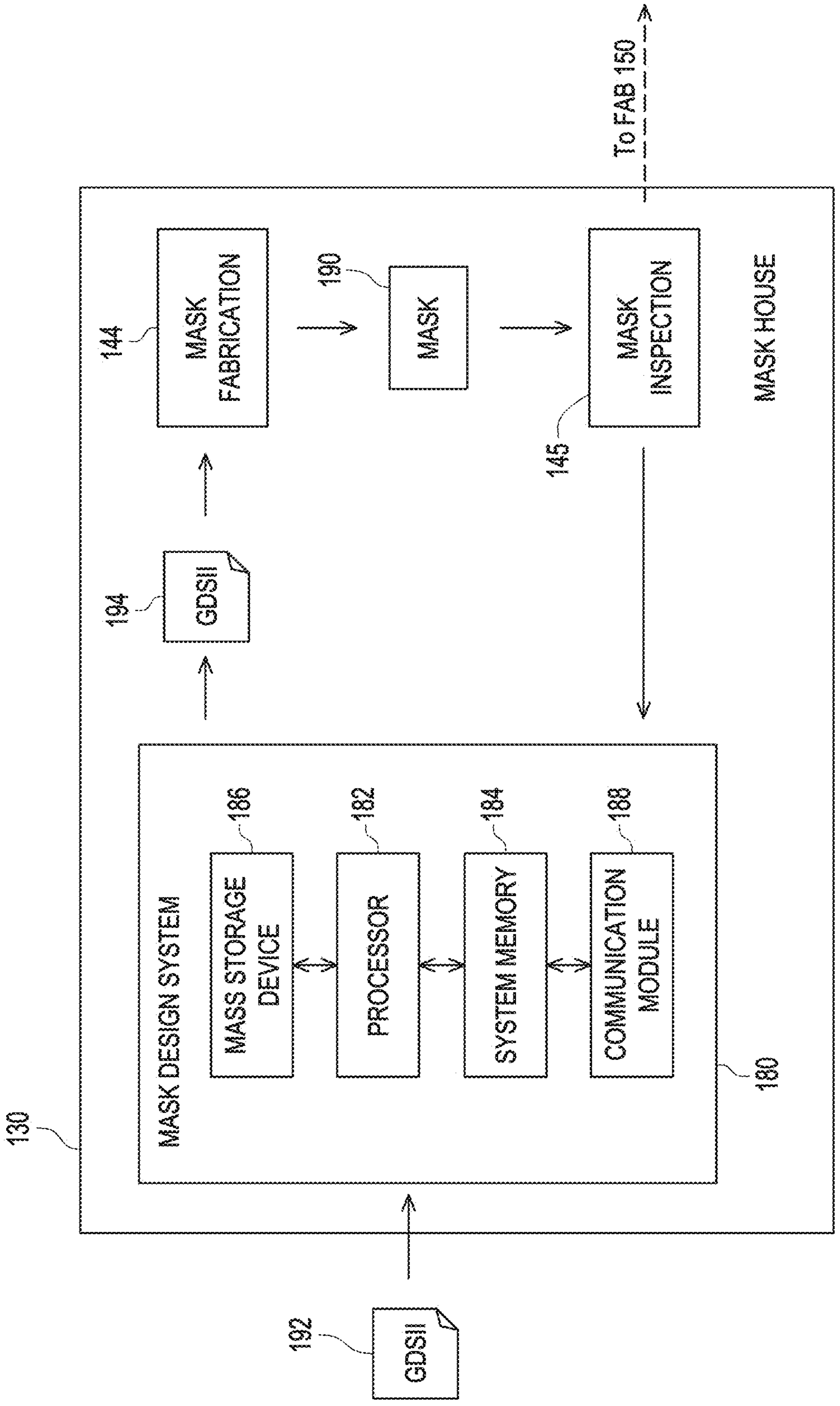
FIG. 2 provides a more detailed block diagram of the mask house shown in FIG. 1, according to various aspects of the present disclosure.

Referring to FIG. 2, provided therein is a more detailed block diagram of the mask house 130 shown in FIG. 1 according to various aspects of the present disclosure. In the example of FIG. 2, the mask house 130 includes a mask design system 180 that is operable to perform the functionality described in association with mask data preparation 132 or mask inspection 145 of FIG. 1 and in association with methods and/or processes described with reference to FIGS. 6-9, discussed below. In particular, the mask design system

180 may receive data from mask inspection 145 and be operable to perform functionality associated with the 3D image algorithm to estimate a surface thickness and sidewall profile, in accordance with various embodiments. In some embodiments, similar functionality associated with the 3D image algorithm may also be provided at the IC manufacturer 150 (e.g., such as at empirical analysis 156). More generally, and in accordance with various embodiments, an information handling system in communication with, and configured to receive data from an SEM with a 360-degree wraparound BSE detector, may implement the functionality associated with the 3D image algorithm, as described herein.

One such information handling system is shown in the context of the mask design system 180 and may include an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory 184 may include random access memory (RAM) devices such as dynamic RAM (DRAM), synchronous DRAM (SDRAM), solid state memory devices, and/or a variety of other memory devices known in the art. Computer programs, instructions, and data are stored within the mass storage device 186. Examples of mass storage devices 186 may include hard discs, optical disks, magneto-optical discs, solid-state storage devices, and/or a variety of other mass storage devices. The communication module 188 is operable to communicate information such as IC design layout files with the other components in the IC manufacturing system 100, such as design house 120. Examples of communication modules 188 may include Ethernet cards, 802.11 WiFi devices, cellular data radios, and/or other suitable devices known in the art. In various embodiments, other information handling systems having similar components may be implemented, for example, at the IC manufacturer 150 (e.g., such as at empirical analysis 156) or elsewhere, such that the information handling system is able to communicate with, and receive data from, an SEM with a 360-degree wraparound BSE detector.

In operation, the mask design system 180 is configured to manipulate the IC design layout 122 according to a variety of design rules and limitations before it is transferred to a mask 190 by mask fabrication 144. For example, in an embodiment, mask data preparation 132, including OPC as one example, may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing a modified IC design layout to mask fabrication 144 (i.e., to a mask fabricator). In alternative embodiments, the IC design layout 122 may be transmitted between the components in IC manufacturing system 100 in alternate file formats such as DFII, CIF, OASIS, or any other suitable file type. Further, the mask design system 180 and the mask house 130 may include additional and/or different components in alternative embodiments. Once the mask fabrication and inspection is complete, the mask may be transferred to the IC manufacturer 150.

Figure 3:
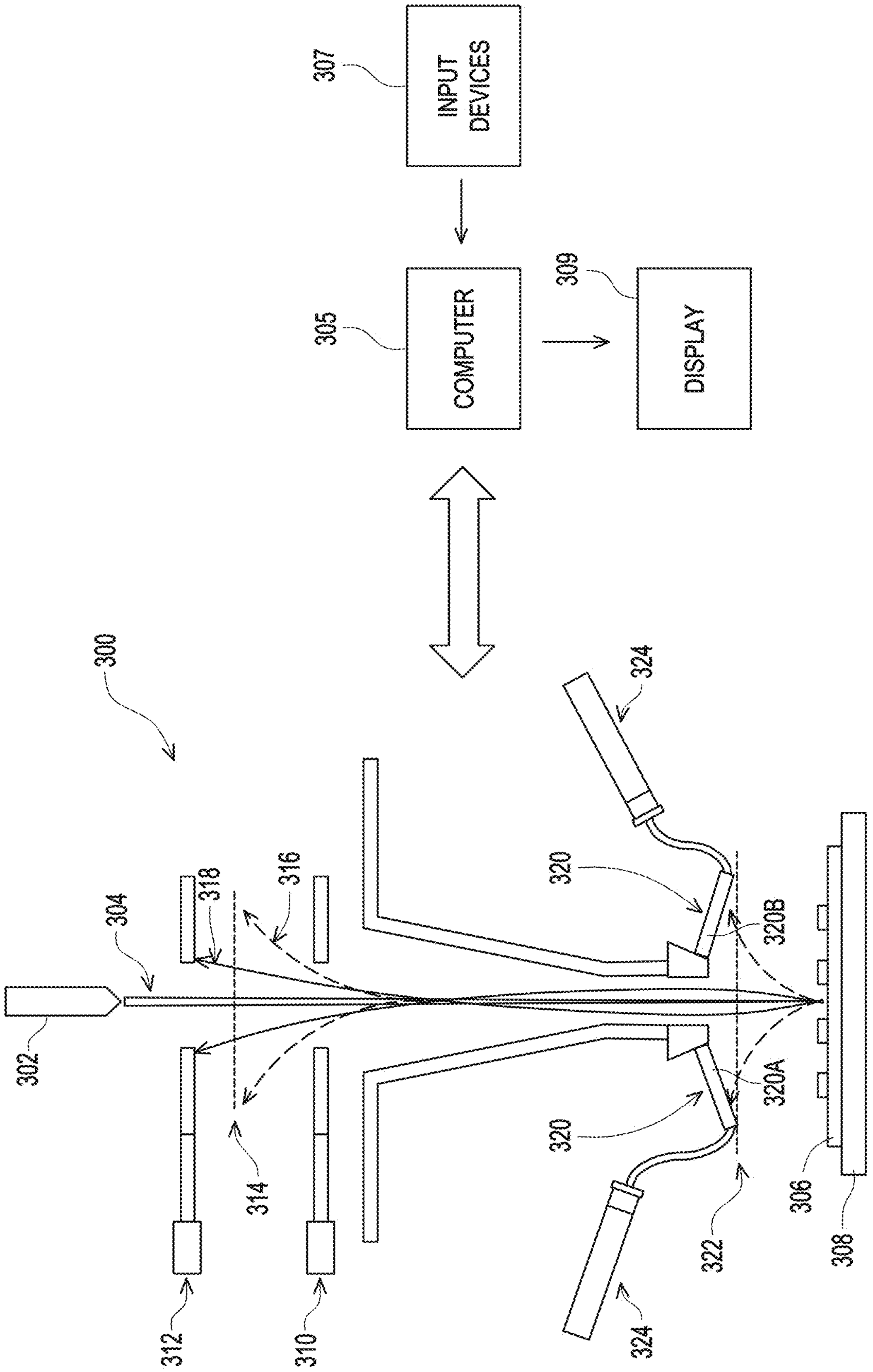
FIG. 3 illustrates a scanning electron microscope (SEM), in accordance with some embodiments.

Referring now to FIG. 3, illustrated therein is an SEM 300, in accordance with various aspects of the present disclosure. While embodiments of the present disclosure are not limited thereto, in some cases the SEM 300 may be implemented by mask inspection 145, by the IC manufacturer 150 (e.g., at empirical analysis 156), or by another facility of the IC manufacturing system 100. As shown, the SEM 300 includes an electron gun 302 that generates an electron beam 304 that is directed along an axis through a column of the SEM 300 to a sample 306 mounted onto a sample stage 308. In some embodiments, the sample 306 may include a mask (photomask or reticle) such as a binary mask, a phase shift mask (PSM), an EUV mask, a DUV, or other type of mask. In various embodiments, the electron gun 302 may include different types of emitters such as tungsten filaments, solid-state hexaboride crystals, and field emission guns. Electrons emitted by the electron gun 302 are accelerated toward an anode at an EHT voltage (e.g., in a range of about 0.1 keV to about 30 keV) that is adjustable in real-time (e.g., by an EHT controller of the SEM 300). A condenser lens, a plurality of apertures, an objective lens 315, deflection coils, and/or other components are configured to focus and project the electron beam 304 onto the sample 306. In an example, the stage 308 is configured to secure the sample 306 onto the stage 308 by a vacuum system and provides for accurate positioning and movement of the sample 306 along X, Y and/or Z directions (e.g., by motor(s) coupled to the stage 308) during focus, leveling, and/or measurement operations. In some embodiments, a vacuum system (e.g., including mechanical pumps, turbo pumps, ion pumps, or other type of pumps) is coupled to the SEM 300 to provide a high-vacuum environment for the SEM 300 (including the column, a sample chamber that houses the stage 308 and sample 306) and to provide other vacuum functionality (e.g., such as securing the sample 306 to the stage 308).

The SEM 300 also includes a detection system, which may include a plurality of different types of detectors such as a secondary electron detector, a backscatter electron detector, an energy selective backscatter detector, and/or an X-ray detector, each of which is configured for a different purpose. In the example of FIG. 3, the SEM 300 includes a secondary electron (SE) detector 310 that detects a signal from interaction between the electron beam 304 projected on the sample 306 and atoms at or near a surface of the sample 306. As a result, the signal acquired by the SE detector 310 can be used to provide a high-resolution image of the surface of the sample 306. The SE detector 310 is mounted on an axis of the electron beam 304 and may be equivalently referred to as an in-lens SE detector 310. The illustrated SEM 300 further includes an energy selective backscatter (EsB) detector 312, which is located above the in-lens SE detector 310. The EsB detector 312 is also mounted along the axis of the electron beam 304 and may be equivalently referred to as an in-lens EsB detector 312 or an in-lens energy selective BSE detector 312. In-lens detectors, in general, include detectors that are located inside the column of the SEM 300 are which are arranged rotationally symmetric around an optical axis (e.g., the axis of the electron beam 304). Thus, in various embodiments, the in-lens SE detector 310 and the in-lens EsB detector 312 are configured to detect backscattered electrons (BSE) that enter the column of the SEM 300. In particular, the EsB detector 312 detects a signal from interaction between the electron beam 304 and atoms deeper within the sample 306. Stated another way, the EsB detector 312 is used to collect higher energy electrons (e.g., as compared to the SE detector 310). The signal acquired by the EsB detector 312 can be used to provide BSE images to visualize different elements (e.g., provide compositional contrast or grayscale variation)

within the sample 306. To prevent detection of secondary electrons (SE) by the EsB detector 312, an energy filtering grid 314 is disposed in front of the EsB detector 312 (e.g., between the SE detector 310 and the EsB detector 312). In some examples, by appropriate biasing of the filtering grid 314, the filtering grid 314 may be used to filter energy between about 0 to 1500 eV. Thus, by activating (turning on) voltage supplied to the filtering grid 314, secondary electrons (SE) will be rejected (e.g., shown as rejected electrons 316) and only backscattered electrons (BSE) (e.g., shown as BSE electrons 318) will be detected by the EsB detector 312. Such energy filtering is important to enhance topographic contrast and compositional imaging of the sample 306. In addition to being able to reject lower energy secondary electrons (SE), the filtering grid 314 may be used to select a desired energy band of BSEs for detection.

In accordance with embodiments of the present disclosure, and as shown in FIG. 3, the SEM 300 also includes a 360-degree wraparound BSE detector assembly 320, which enables obtaining BSE images of a sidewall of the sample 306, as described herein. An energy filtering grid 322 is disposed in front of the wraparound BSE detector assembly 320 to allow for selection of a specified energy band of BSEs to be detected by the wraparound BSE detector assembly 320 (e.g., by supplying an appropriate voltage to the filtering grid 322 to activate or turn on the filtering grid 322). Thus, in various embodiments, the 360-degree wraparound BSE detector assembly 320 may also be referred to as an energy selective backscatter (EsB) detector assembly 320 or a 360-degree wraparound EsB detector assembly 320. In various embodiments, the filtering grid 322 can also be used to improve the signal-to-noise ratio and enhance the contrast and resolution of the BSE imaging. The 360-degree wraparound EsB detector assembly 320 is an out-lens detector (e.g., located outside the column of the SEM 300 and configured to detect backscattered electrons (BSE) that do not enter the column of the SEM 300). In addition, the wraparound EsB detector assembly 320 includes plural EsB detectors (e.g., such as blades 320A, 320B in FIG. 3, or blades 402A-402D, 404A-404D, 406A-406L in FIG. 4, discussed below) mounted off the axis of the electron beam 304 and wrapping around (or encircling) a bottom portion of the column of the SEM 300 (e.g., adjacent to a bottom portion of the objective lens 315). The plural EsB detectors (e.g., the blades, which may also be referred to as sub-detectors), are separated or spaced apart from each other and are each mounted off axis, as noted above, while the overall 360-degree wraparound EsB detector assembly 320 is on the axis of the electron beam 304. The backscattered electrons (BSE) detected by the wraparound EsB detector assembly 320 may be referred to as low-angle backscattered electrons, as opposed to high-angle backscattered electrons that are detected by the EsB detector 312. Like the EsB detector 312, the signal acquired by the wraparound EsB detector assembly 320 can be used to provide BSE images to visualize different elements (e.g., provide compositional contrast or grayscale variation) within the sample 306. However, the BSE images generated by the wraparound EsB detector assembly 320 may include data associated with sidewalls of the sample 306 and can further be used to generate a 3D image of the surface of the sample 306, as described in more detail below. In various examples, each of the plural EsB detectors (e.g., each of the blades) of the wraparound EsB detector assembly 320 may be used to capture or provide images independently, where the independently captured images may be combined to provide a complete EsB detector assembly 320 image of the sample 306. Also, in some embodiments, the BSE images generated by the EsB detector 312 and the wraparound EsB detector assembly 320 may be combined to provide the compositional contrast or grayscale variation, and/or to generate the 3D image of the surface of the sample 306.

As shown in FIG. 3, the wraparound EsB detector assembly 320 is further optically coupled to one or more photomultiplier tubes (PMTs) 324 for electron multiplication and conversion to an electric signal, which is used to generate the BSE images associated with the wraparound EsB detector assembly 320. In some embodiments, the PMTs 324 include a high quantum efficiency GaAs photocathode, in contrast to at least some existing PMTs which include photocathodes composed of bialkali or multialkali metals. In some cases, the GaAs photocathode of the PMTs 324 includes GaAs nanowires to provide the higher quantum efficiency, as well as longer lifetime and greater stability. Additionally, in some embodiments, the PMTs 324 include microchannel plates (MCPs) made of GaAs that may be integrated directly onto a surface of the photocathode to enhance performance. Such MCPs would provide higher gain, better spatial resolution, and lower noise than at least some existing MCPs (e.g., such as glass MCPs).

Generally, the SEM 300 may be coupled to a computer 305, which may include an information handling system similar to that described above with reference to the system 180 of FIG. 2. Thus, the computer 305 may similarly include a processor communicatively coupled to a system memory, a mass storage device, a communication module, and/or other suitable components known in the art. The computer may receive inputs from a user via input devices 307 (e.g., such as a keyboard, mouse, or other input device) that are coupled to the computer 305. Further, the computer 305 may be coupled to a display 309 (e.g., such as a computer monitor). In various examples, the computer 305 may receive signals and/or images (e.g., surfaces images, BSE images, or other images) captured by the SE detector 310, the EsB detector 312, the EsB detector assembly 320, an X-ray detector, or other detector of the SEM 300 and provide the images to the display 309 for viewing by the user.

Figure 4:
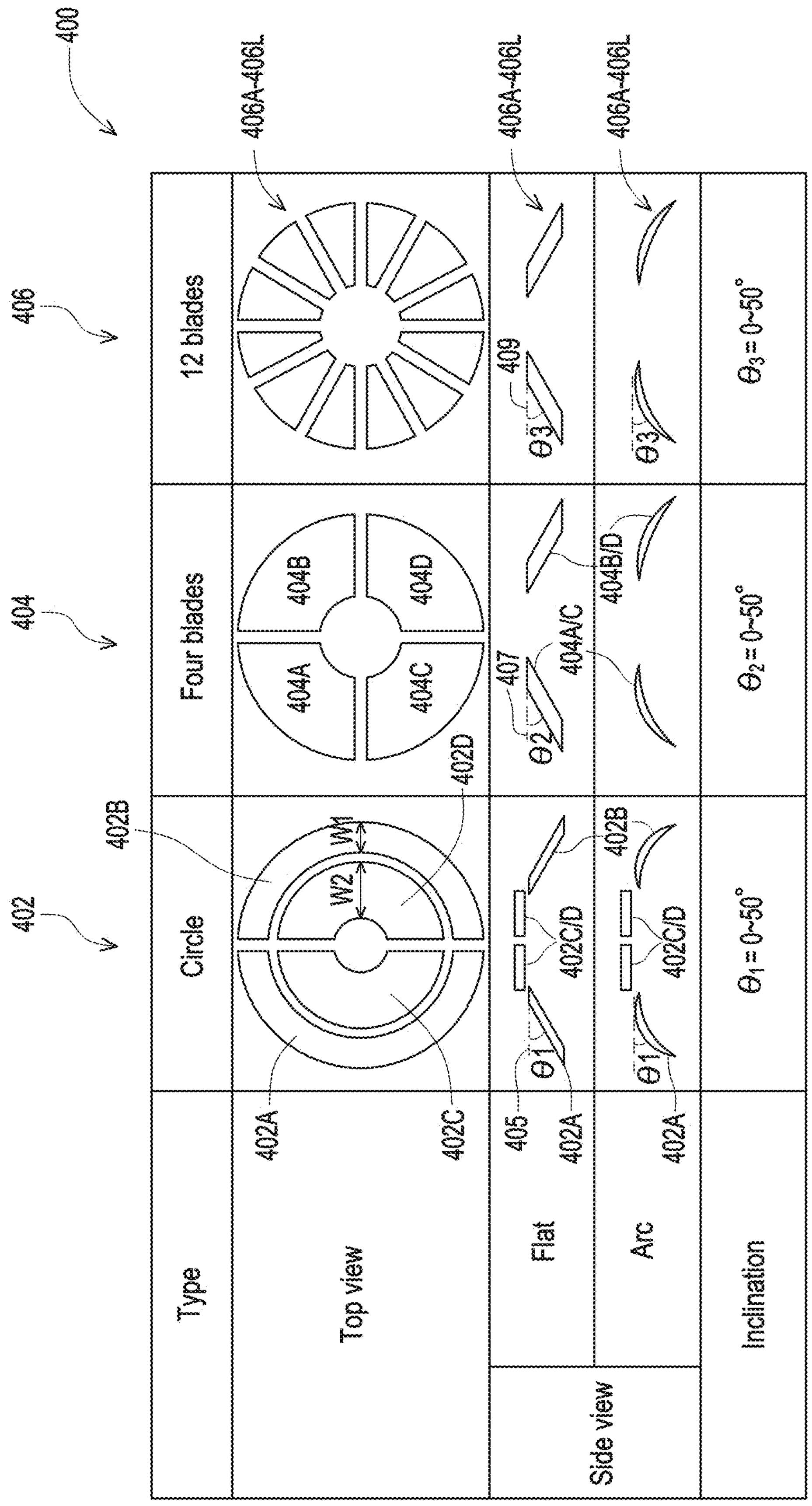
FIG. 4 illustrates a table that depicts top views and side views of various types or configurations of a wraparound EsB detector, in accordance with some embodiments.

Referring to FIG. 4, illustrated therein is a table 400 that depicts top views and side views of various types or configurations of the wraparound EsB detector assembly 320, in accordance with some embodiments. In accordance with the previous description of the wraparound EsB detector assembly 320, each of the various types or configurations shown in the table 400 include out-lens BSE detectors that are configured to wrap around the bottom portion of the column of the SEM 300 (e.g., adjacent to a bottom portion of the objective lens 315). In some examples, each of the types or configurations shown in the table 400 has a plurality of blades (e.g., having either a flat shape or an arc shape, in a side view) strategically positioned at various angles, where the plurality of blades provide for capturing backscattered electrons from a full 360-degree range around the sample 306 and for thus obtaining BSE images of a sidewall of the sample 306.

In column 402 of the table 400, a first configuration of the wraparound EsB detector assembly 320 includes a circular configuration having four blades 402A, 402B, 402C, 402D. In some embodiments, the blades 320A, 320B (FIG. 3) may include any of the blades 402A-402D. As shown in the top view of the column 402, the blades 402A and 402B define an outer circular portion, and the blades 402C and 402D define an inner circular portion coaxial with the outer circular portion. In an example, and with reference to the top view, a width W1 of the blades 402A/402B may be less than a width W2 of the blades 402C/402D. However, in other cases, the width W1 of the blades 402A/402B may be greater than the width W2 of the blades 402C/402D. In still other examples, the width W1 of the blades 402A/402B the width W2 of the blades 402C/402D may be substantially equal to each other. In some examples, the blades 402A and 402B may be substantially the same as each other (e.g., having a similar size, shape, width, etc.), and the blades 402C and 402D may be substantially the same as each other (e.g., having a similar size, shape, width, etc.). In some embodiments, and as shown in the side view of the column 402, the blades 402C/402D of the inner circular portion may be substantially flat. The blades 402A/402B of the outer circular portion may have a substantially flat shape or an arc shape (in a side view), in various embodiments. Further, in some embodiments and regardless of the flat or arc shape of the blades 402A/402B, the blades 402A/402B of the outer circular portion may be inclined or rotated with respect to the blades 402C/402D of the inner circular portion, as shown. In various examples, an angle of inclination θ1 is defined between a substantially horizontal plane 405 (in the side view), corresponding to an orientation of the blades 402C/402D, and a surface of the inclined or rotated blades 402A/402B. In some embodiments, the angle of inclination θ1 is in a range of between about 0-50 degrees. Thus, in at least some cases (e.g., when the angle of inclination θ1 is equal to about 0 degrees), all four of the blades 402A, 402B, 402C, 402D may be oriented in a substantially horizontal orientation (in the side view).

In column 404 of the table 400, a second configuration of the wraparound EsB detector assembly 320 includes a circular configuration having four blades 404A, 404B, 404C, 404D. In some embodiments, the blades 320A, 320B (FIG. 3) may include any of the blades 404A-404D. In contrast to the first configuration of the column 402, and as shown in the top view of the column 404, the four blades 404A, 404B, 404C, 404D collectively define a circular second blade configuration. In an example, each of the blades 404A, 404B, 404C, 404D may be substantially the same as each other (e.g., having a similar size, shape, width, etc.). Although in some cases, one or more of the blades 404A, 404B, 404C, 404D may be different than the others. Each of the blades 404A, 404B, 404C, 404D may have a substantially flat shape or an arc shape (in a side view), in various embodiments. As shown in the side view of the column 404, in some embodiments and regardless of the flat or arc shape of the blades 404A, 404B, 404C, 404D, the blades 404A, 404B, 404C, 404D may be inclined or rotated such that an angle of inclination θ2 is defined between a substantially horizontal plane 407 (in the side view) and a surface of the inclined or rotated blades 404A/404B/404C/404D. In some embodiments, the angle of inclination θ2 is in a range of between about 0-50 degrees. Thus, in at least some cases (e.g., when the angle of inclination θ2 is equal to about 0 degrees), all four of the blades 404A, 404B, 404C, 404D may be oriented in a substantially horizontal orientation (in the side view).

In column 406 of the table 400, a third configuration of the wraparound EsB detector assembly 320 includes a circular configuration having twelve blades 406A-406L. In some embodiments, the blades 320A, 320B (FIG. 3) may include any of the blades 406A-406L. In contrast to the first configuration of the column 402 but similar to the second configuration of the column 404, and as shown in the top view of the column 406, the twelve blades 406A-406L collectively define a circular third blade configuration. In an example, each of the twelve blades 406A-406L may be substantially the same as each other (e.g., having a similar size, shape, width, etc.). Although in some cases, one or more of the twelve blades 406A-406L may be different than the others. Each of the twelve blades 406A-406L may have a substantially flat shape or an arc shape (in a side view), in various embodiments. As shown in the side view of the column 406, in some embodiments and regardless of the flat or arc shape of the blades 406A-406L, each of the twelve blades 406A-406L may be inclined or rotated such that an angle of inclination θ3 is defined between a substantially horizontal plane 409 (in the side view) and a surface of the inclined or rotated blades 406A-406L. In some embodiments, the angle of inclination θ3 is in a range of between about 0-50 degrees. Thus, in at least some cases (e.g., when the angle of inclination θ3 is equal to about 0 degrees), all twelve of the blades 406A-406L may be oriented in a substantially horizontal orientation (in the side view).

While some examples of various types or configurations of the wraparound EsB detector assembly 320 have been provided, it will be understood that other configurations may equally be implemented, without departing from the scope of the present disclosure. For instance, in some cases and as a variation to the first configuration of column 402, an intermediate circular portion (composed of two blades of similar shape to those in the inner and outer circular portions) may interpose the outer circular portion and the inner circular portion. Stated another way, a first blade of the intermediate circular portion may interpose the blades 402B and 402D, and a second blade of the intermediate circular portion may interpose the blades 402A and 402C. In other cases, and as variations to the second configuration of column 404 and the third configuration of column 406, the configurations of the wraparound EsB detector assembly 320 may include another number of blades that collectively define a circular blade configuration. For example, in some embodiments, the wraparound EsB detector assembly 320 includes a circular configuration having two blades, six blades, eight blades, ten blades, or another number of blades.

As previously noted, the SEM 300 (including the wraparound EsB detector assembly 320) may be used in any of a number of different applications such mask repair or inspection, mask in-line process monitoring, mask in-line structure verification, mask OPC design, or for mask CD SEM measurement, among other applications. In particular, mask patterns need to be very accurate (e.g., being substantially free of mask defects) for advanced technology nodes. Thus, as an illustrative case, an example of using the SEM 300 (including the wraparound EsB detector assembly 320) for mask repair or inspection is now provided.

Figure 5:
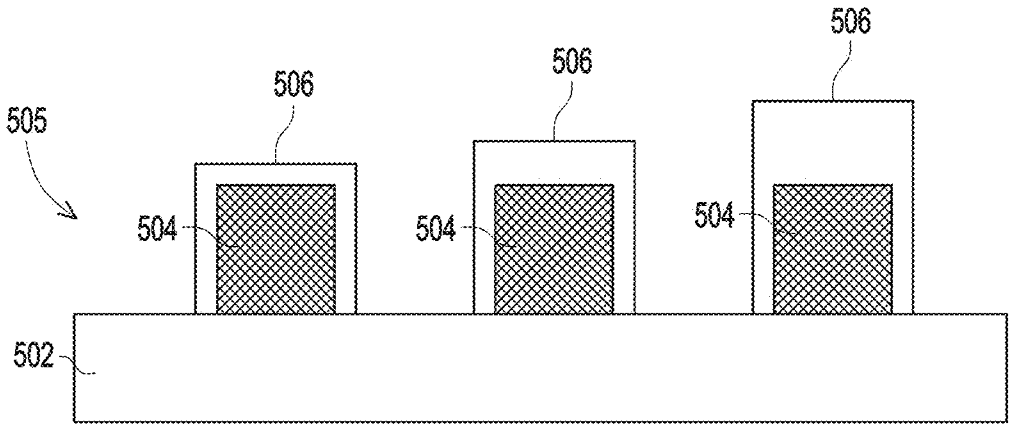
FIG. 5 illustrates an exemplary sample, such as a photomask, in accordance with some embodiments.

If a mask is found to have a defect, it may be necessary to selectively remove or deposit layers onto the mask. FIG. 5 illustrates an exemplary sample 505 (or mask 505), which may include the sample 306, discussed above. Thus, the sample 505 may likewise include a mask such as a binary mask, a phase shift mask (PSM), an EUV mask, a DUV, or other type of mask. In an embodiment, the mask 505 includes a quartz substrate 502. As one example, when defects such as peeling occur during mask production, chromium (Cr) deposition (e.g., by electron beam induced deposition, EBID) may be performed to fill a missing pattern. In the example of FIG. 5, such selectively deposited Cr layers 504 are illustrated as being formed over the substrate 502 to repair various defects. Afterwards, the deposited Cr layers 504 may be capped with respective tetraethylorthosilicate (TEOS) capping layers 506, which may also be deposited via EBID, to safeguard the Cr layers 504 from degradation (e.g., during a subsequent photolithography process). While a target thickness for the TEOS capping layer 506 may be defined (e.g., such as about 10 nm), in practice the thickness of the TEOS capping layer 506 may not always comply with the target thickness, and/or thicknesses of the TEOS capping layer 506 along a top surface and/or along sidewalls of a given Cr layer 504, or between different Cr layers 504, may not be uniform (e.g., as generally depicted in FIG. 5). As previously noted, available techniques for validation/inspection of such repairs are limited in their ability to provide accurate and reliable structural information, particularly along sidewalls of a repaired region (e.g., including the TEOS capping layer 506 on a sidewall of the Cr layer 504).

Figure 6:
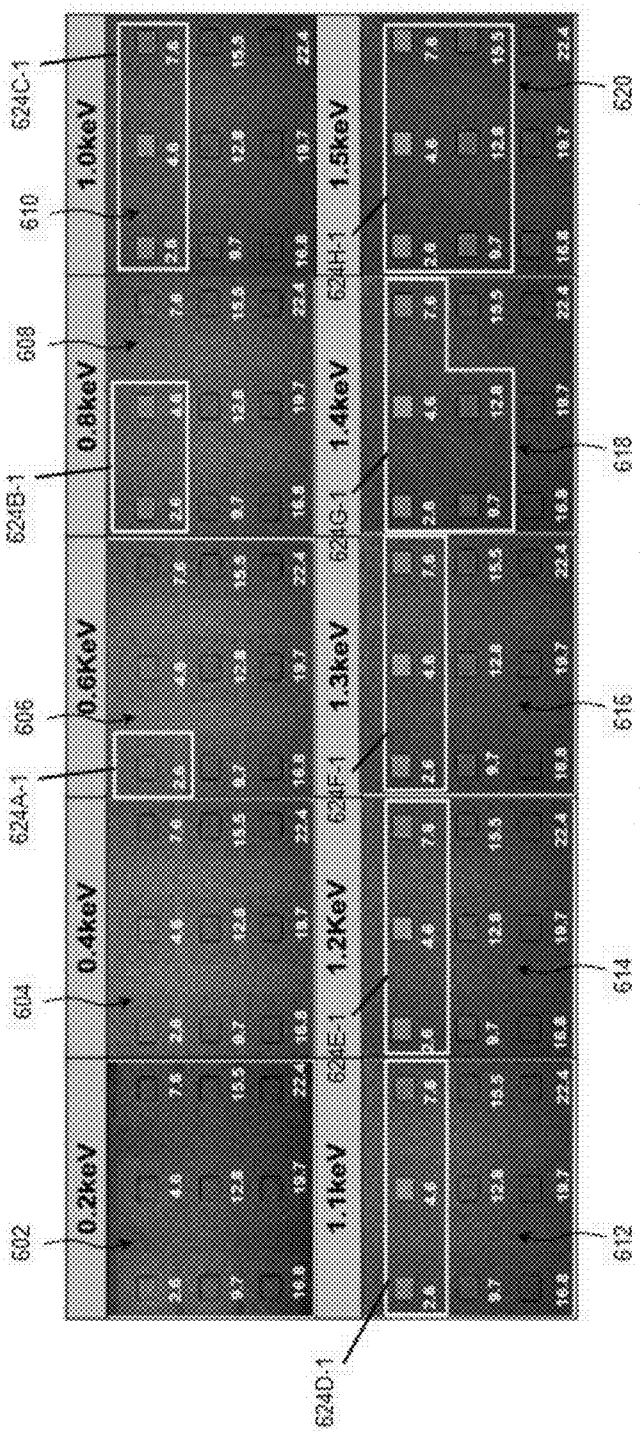
FIG. 6 illustrates a plurality of BSE images captured at different EHT voltages, and a table including corresponding grayscale intensity values, in accordance with some embodiments.

The SEM 300 is capable of acquiring various types of images and information about a sample, such as the samples 505 or 305, discussed above. By way of illustration, consider now that the SEM 300 (including the wraparound EsB detector assembly 320) is used to inspect TEOS capping layers (e.g., such as the TEOS capping layers 506) formed over respective Cr layers (e.g., such as the Cr layers 504), which have been deposited to repair a mask defect (e.g., such as to fill a missing pattern). As an example, and with reference to FIG. 6, illustrated therein is a plurality of BSE images 602, 604, 606, 608, 610, 612, 614, 616, 618, 620 captured by the SEM 300 using different EHT voltages, where the EHT voltage may be adjusted in real-time by the EHT voltage controller of the SEM 300. In the illustrative example, each of the BSE images 602, 604, 606, 608, 610, 612, 614, 616, 618, 620 includes a 3×3 array of Cr squares (e.g., similar to the Cr layers 504) capped by TEOS capping layers (e.g., similar to the TEOS capping layers 506) of various thicknesses. In particular, the variable EHT voltages can be used to generate (or capture) the BSE images 602, 604, 606, 608, 610, 612, 614, 616, 618, 620 with varying grayscale intensities, which can be used to determine a film thickness (or height) of the TEOS capping layer formed over the 3×3 array of Cr squares. In other applications, the varying grayscale intensities may be used to determine a film thickness (or height) or an alternative layer composition or type. In some embodiments, the BSE images 602, 604, 606, 608, 610, 612, 614, 616, 618, 620 may be captured by the EsB detector 312. In some cases, the BSE images may be captured by the wraparound EsB detector assembly 320 or by a combination of the EsB detector 312 and the wraparound EsB detector assembly 320, for example, to enhance the quality of the BSE images. To be sure, in accordance with embodiments of the present disclosure, BSE images generated by the wraparound EsB detector assembly 320 may include data associated with sidewalls of a sample (e.g., such as data regarding a TEOS capping layer formed on a sidewall of a Cr layer) and can further be used to generate a 3D image of the surface of the sample, as described further below.

Still with reference to FIG. 6, the BSE image 602 is captured at an EHT voltage of 0.2 keV, the BSE image 604 is captured at an EHT voltage of 0.4 keV, the BSE image 606 is captured at an EHT voltage of 0.6 keV, the BSE image 608 is captured at an EHT voltage of 0.8 keV, the BSE image 610 is captured at an EHT voltage of 1.0 keV, the BSE image 612 is captured at an EHT voltage of 1.1 keV, the BSE image 614 is captured at an EHT voltage of 1.2 keV, the BSE image 616 is captured at an EHT voltage of 1.3 keV, the BSE image 618 is captured at an EHT voltage of 1.4 keV, and the BSE image 620 is captured at an EHT voltage of 1.5 keV. Beneath each Cr square of the 3×3 array of Cr squares, in the BSE images, is a number indicating a measured thickness (nm) of the TEOS capping layer deposited over the respective Cr square. As shown, the various measured thicknesses of the TEOS capping layer include 2.6 nm, 4.6 nm, 7.6 nm, 9.7 nm, 12.8 nm, 15.5 nm, 16.8 nm, 19.7 nm, and 22.4 nm.

FIG. 6 also illustrates a table 622 that includes grayscale intensity values for each of the TEOS capping layers formed over respective ones of the Cr squares of the 3×3 array of Cr squares within each of the BSE images 602, 604, 606, 608, 610, 612, 614, 616, 618, 620. The first column 'Height (nm)' of the table 622 includes rounded values of the various measured thicknesses of the TEOS capping layers formed over the respective Cr squares, where 3 nm in the table 622 corresponds to 2.6 nm in the BSE images, 5 nm in the table 622 corresponds to 4.6 nm in the BSE images, 8 nm in the table 622 corresponds to 7.6 nm in the BSE images, 10 nm in the table 622 corresponds to 9.7 nm in the BSE images, 13 nm in the table 622 corresponds to 12.8 nm in the BSE images, 16 nm in the table 622 corresponds to 15.5 nm in the BSE images, 17 nm in the table 622 corresponds to 16.8 nm in the BSE images, 20 nm in the table 622 corresponds to 19.7 nm in the BSE images, and 22 nm in the table 622 corresponds to 22.4 nm in the BSE images. Thus, each row in the table 622 corresponds to a different one of the Cr squares of the 3×3 array of Cr squares, as identified by the thickness of the TEOS capping layer given for each of the respective rows of the table 622.

The second column '0.2 keV' of the table 622 corresponds to the BSE image 602, the third column '0.4 keV' of the table 622 corresponds to the BSE image 604, the fourth column '0.6 keV' of the table 622 corresponds to the BSE image 606, the fifth column '0.8 keV' of the table 622 corresponds to the BSE image 608, the sixth column '1.0 keV' of the table 622 corresponds to the BSE image 610, the seventh column '1.1 keV' of the table 622 corresponds to the BSE image 612, the eighth column '1.2 keV' of the table 622 corresponds to the BSE image 614, the ninth column '1.3 keV' of the table 622 corresponds to the BSE image 616, the tenth column '1.4 keV' of the table 622 corresponds to the BSE image 618, and the eleventh column '1.5 keV' of the table 622 corresponds to the BSE image 620.

As previously noted, the TEOS capping layers formed over respective ones of the Cr squares of the 3×3 array of Cr squares may be deposited using EBID. In various embodiments, the deposition rate of the TEOS used to form the TEOS capping layers may be adjusted by varying a dwell time of the electron beam used during EBID. For instance, by increasing the dwell time of the electron beam, a higher deposition rate (and thus thickness) of the TEOS capping layer may be achieved. In various embodiments, a target thickness for the TEOS capping layers formed over respective ones of the Cr squares may be around 10 nm, and any deviations from the target thickness may be detected using the varying grayscale intensities of the BSE images. To be sure, in other embodiments, different target thicknesses may be equally used without departing from the scope of the present disclosure.

In the table 622, the grayscale intensity values may range from 0 to 255, where 0 corresponds to a black pixel of a respective BSE image and 255 corresponds to a white pixel of the respective BSE image. Thus, the different values in the table 622 indicate different levels of grayscale compared to a background material (e.g., such as silicon, or in some cases quartz). Further, in the table 622, boxes 624A-624H are drawn around adjacent grayscale intensity values, for a given EHT voltage, where the adjacent grayscale intensity values correspond to successive thickness values of the TEOS capping layer. In particular, the adjacent grayscale intensity values shown in each of the boxes 624A-624H represent a sufficient change (delta) in grayscale intensity values to enable distinguishing between a bright layer (metal, such as Cr) and a dark layer (non-metal, such as TEOS). In each of the boxes 624A-624H, the grayscale intensity value in the lower row is the lesser grayscale intensity value (corresponding to the dark, non-metal layer), and the grayscale intensity value in the upper row is the greater grayscale intensity value (corresponding to the bright, metal layer). In some embodiments, the change (delta) in the adjacent grayscale intensity values in each of the boxes 624A-624H is in a range of about 1.5× to about 3.8×. In some cases, it may be generally said that the change (delta) in adjacent grayscale intensity values in each of the boxes 624A-624H represents about a 2-fold (or more) difference in grayscale intensity values.

In view of the above, with reference to box 624A and under 0.6 keV EHT, it will be understood that the backscattered electrons cannot pass through a 5 nm TEOS capping layer on the Cr film, resulting in a dark appearance (similar to the image background) for Cr squares in the BSE image 606 having TEOS capping layers with a thickness of 5 nm or greater. In contrast, and still with reference to box 624A and under 0.6 keV EHT, the backscattered electrons can pass through a 3 nm TEOS capping layer on the Cr film, resulting in a bright (or brighter) appearance for the Cr square in the BSE image 606 having a TEOS capping layer with a thickness of 3 nm. A box 624A-1 in the BSE image 606 represents a region having a bright (metal) area.

With reference to box 624B and under 0.8 keV EHT, the backscattered electrons cannot pass through an 8 nm TEOS capping layer on the Cr film, resulting in a dark appearance (similar to the image background) for Cr squares in the BSE image 608 having TEOS capping layers with a thickness of 8 nm or greater. In contrast, and still with reference to box 624B and under 0.8 keV EHT, the backscattered electrons can pass through a 5 nm TEOS capping layer on the Cr film, resulting in a bright (or brighter) appearance for the Cr squares in the BSE image 608 having a TEOS capping layer with a thickness of 5 nm or less. A box 624B-1 in the BSE image 608 represents a group of bright (metal) areas.

With reference to box 624C and under 1.0 keV EHT, the backscattered electrons cannot pass through a 10 nm TEOS capping layer on the Cr film, resulting in a dark appearance (similar to the image background) for Cr squares in the BSE image 610 having TEOS capping layers with a thickness of 10 nm or greater. In contrast, and still with reference to box 624C and under 1.0 keV EHT, the backscattered electrons can pass through an 8 nm TEOS capping layer on the Cr film, resulting in a bright (or brighter) appearance for the Cr squares in the BSE image 610 having a TEOS capping layer with a thickness of 8 nm or less. A box 624C-1 in the BSE image 610 represents a group of bright (metal) areas.

With reference to box 624D and under 1.1 keV EHT, the backscattered electrons cannot pass through a 10 nm TEOS capping layer on the Cr film, resulting in a dark appearance (similar to the image background) for Cr squares in the BSE image 612 having TEOS capping layers with a thickness of 10 nm or greater. In contrast, and still with reference to box 624D and under 1.1 keV EHT, the backscattered electrons can pass through an 8 nm TEOS capping layer on the Cr film, resulting in a bright (or brighter) appearance for the Cr squares in the BSE image 612 having a TEOS capping layer with a thickness of 8 nm or less. A box 624D-1 in the BSE image 612 represents a group of bright (metal) areas.

With reference to box 624E and under 1.2 keV EHT, the backscattered electrons cannot pass through a 10 nm TEOS capping layer on the Cr film, resulting in a dark appearance (similar to the image background) for Cr squares in the BSE image 614 having TEOS capping layers with a thickness of 10 nm or greater. In contrast, and still with reference to box 624E and under 1.2 keV EHT, the backscattered electrons can pass through an 8 nm TEOS capping layer on the Cr film, resulting in a bright (or brighter) appearance for the Cr squares in the BSE image 614 having a TEOS capping layer with a thickness of 8 nm or less. A box 624E-1 in the BSE image 614 represents a group of bright (metal) areas.

With reference to box 624F and under 1.3 keV EHT, the backscattered electrons cannot pass through a 10 nm TEOS capping layer on the Cr film, resulting in a dark appearance (similar to the image background) for Cr squares in the BSE image 616 having TEOS capping layers with a thickness of 10 nm or greater. In contrast, and still with reference to box 624F and under 1.3 keV EHT, the backscattered electrons can pass through an 8 nm TEOS capping layer on the Cr film, resulting in a bright (or brighter) appearance for the Cr squares in the BSE image 616 having a TEOS capping layer with a thickness of 8 nm or less. A box 624F-1 in the BSE image 616 represents a group of bright (metal) areas.

With reference to box 624G and under 1.4 keV EHT, the backscattered electrons cannot pass through a 16 nm TEOS capping layer on the Cr film, resulting in a dark appearance (similar to the image background) for Cr squares in the BSE image 618 having TEOS capping layers with a thickness of 16 nm or greater. In contrast, and still with reference to box 624G and under 1.4 keV EHT, the backscattered electrons can pass through a 13 nm TEOS capping layer on the Cr film, resulting in a bright (or brighter) appearance for the Cr squares in the BSE image 618 having a TEOS capping layer with a thickness of 13 nm or less. A box 624G-1 in the BSE image 618 represents a group of bright (metal) areas.

With reference to box 624H and under 1.5 keV EHT, the backscattered electrons cannot pass through a 17 nm TEOS capping layer on the Cr film, resulting in a dark appearance (similar to the image background) for Cr squares in the BSE image 620 having TEOS capping layers with a thickness of 17 nm or greater. In contrast, and still with reference to box 624H and under 1.5 keV EHT, the backscattered electrons can pass through a 16 nm TEOS capping layer on the Cr film, resulting in a bright (or brighter) appearance for the Cr squares in the BSE image 620 having a TEOS capping layer with a thickness of 16 nm or less. A box 624H-1 in the BSE image 620 represents a group of bright (metal) areas.

In view of the discussion of FIG. 6, it is evident that by using the variable EHT voltage of the SEM 300, different thicknesses of a non-metal (e.g., such as TEOS) on a metal (e.g., such as a Cr film) can be distinguished in a BSE image. Stated another way, the variable EHT voltages used to generate (or capture) the BSE images 602, 604, 606, 608, 610, 612, 614, 616, 618, 620 with varying grayscale intensities can be readily used to determine and/or differentiate a film thickness (or height) of the TEOS capping layer formed over respective ones of the 3×3 array of Cr squares.

Figure 7:
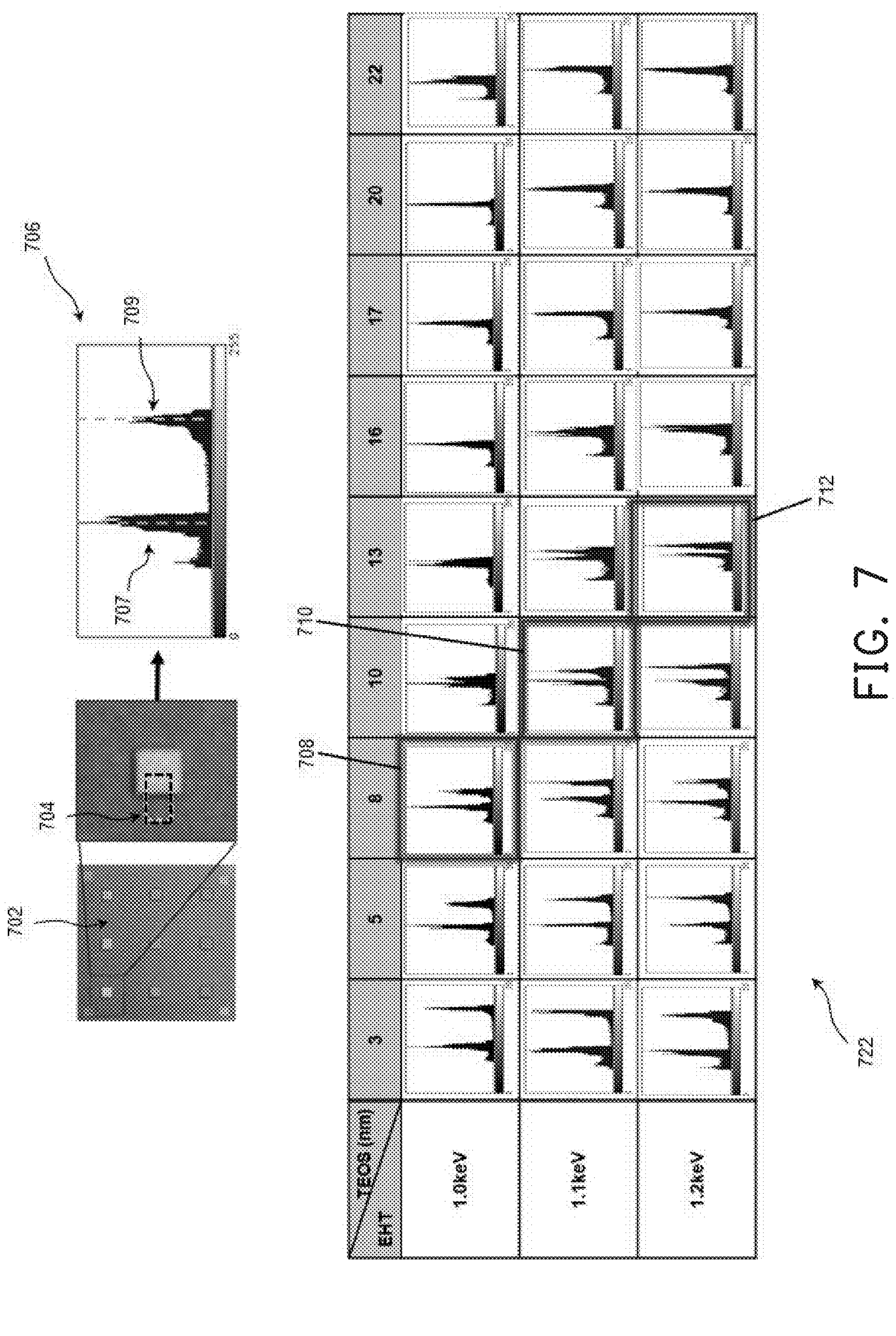
FIG. 7 illustrates use of a Gaussian filter to differentiate thicknesses of a non-metal on a metal, in accordance with some embodiments.

While the varying grayscale intensities of the BSE images provided by modulating the EHT voltage provides a way to differentiate thicknesses of a non-metal on a metal, as discussed above, other embodiments are possible. For example, in some cases, a Gaussian filter can be used to differentiate thicknesses of a non-metal on a metal. The Gaussian filter also has the ability to substantially eliminate noise. By way of illustration, and with reference to FIG. 7, illustrated therein is an exemplary BSE image 702. Like the BSE images of FIG. 6, the BSE image 702 includes a 3×3 array of Cr squares (e.g., similar to the Cr layers 504) capped by TEOS capping layers (e.g., similar to the TEOS capping layers 506) of various thicknesses. For the BSE image 702, captured at a given EHT voltage, a region of interest 704 may be identified for processing using the Gaussian filter. As shown, the region of interest 704 includes an interface region between a given Cr square (with a TEOS capping layer) and a background material (e.g., such as silicon, or in some cases quartz). In the illustrated example, processing the region of interest 704 using the Gaussian filter results in an image histogram 706, where an X-axis of the image histogram 706 includes a pixel value (or grayscale intensity value) that can range from 0 to 255, as previously discussed, and the Y-axis of the image histogram 706 includes a total count. The image histogram 706 includes a bimodal histogram having two distinct peaks 707, 709 (or groups 707, 709), which correspond to respective ones of the Cr square and the background material within the region of interest 704. Thus, the example of the image histogram 706 illustrates successful differentiation between a bright layer (metal) and a dark layer (non-metal). Further, in some cases, the BSE image 702 may be captured at a variety of EHT voltages to provide varying image histograms, as described below.

FIG. 7 also illustrates a table 722 that includes image histograms for regions of interest (similar to the region of interest 704) corresponding to interface regions between each Cr square (having a TEOS capping layer) of the 3×3 array of Cr squares and the background material. Each of the Cr squares of the 3×3 array of Cr squares is identified in the table 722 by the corresponding TEOS capping layer thickness (shown along the top of the table) formed over respective ones of the Cr squares. As discussed with respect to FIG. 6, the various thicknesses of the TEOS capping layers formed over the respective Cr squares of the 3×3 array of Cr squares includes 3 nm, 5 nm, 8 nm, 10 nm, 13 nm, 16 nm, 17 nm, 20 nm, and 22 nm. In various embodiments, BSE images may be captured at a variety of EHT voltages, which can be adjusted in real-time, in order generate BSE images (with varying grayscale intensities) for processing using the Gaussian filter to differentiate thicknesses of a non-metal on a metal. In the table 722, exemplary EHT voltage values are shown as 1.0 keV, 1.1 keV, and 1.2 keV. Generally, the example shown in the table 722 illustrates that the provided range of EHT voltage values 1.0 to 1.2 keV EHT can be used to differentiate between bright (metal) and dark (non-metal) 8 nm to 13 nm TEOS by generation of image histograms based on an analysis of grayscale intensity values using the Gaussian filter. More specifically, as shown in the table 722 and for each of the rows corresponding to 1.0 keV EHT, 1.1 keV EHT, and 1.2 keV EHT, the Gaussian filter may be used to generate a plurality of image histograms (an image histogram for each Cr square and corresponding to each TEOS capping layer thickness). As noted above, successful differentiation between a bright layer (metal) and a dark layer (non-metal) is indicated when the image histogram displays two different groups (a bimodal histogram). Otherwise, if the image histogram includes only one group, it will be interpreted to be a dark layer (non-metal). Thus, for the row corresponding to 1.0 keV EHT, image histogram 708 (which corresponds to an 8 nm TEOS capping layer thickness) includes a bimodal histogram, as do the image histograms corresponding to TEOS capping layer thicknesses less than 8 nm. Similarly, for the row corresponding to 1.1 keV EHT, image histogram 710 (which corresponds to a 10 nm TEOS capping layer thickness) includes a bimodal histogram, as do the image histograms corresponding to TEOS capping layer thicknesses less than 10 nm. Further, for the row corresponding to 1.2 keV EHT, image histogram 712 (which corresponds to a 13 nm TEOS capping layer thickness) includes a bimodal histogram, as do the image histograms corresponding to TEOS capping layer thicknesses less than 13 nm. Thus, using the Gaussian filter technique can also be used to differentiate thicknesses of a non-metal on a metal. More particularly, despite the variations in analytical procedures for differentiating thicknesses of a non-metal on a metal as discussed with reference to FIGS. 6 and 7, both techniques may be used to produce comparable outcomes.

Figure 8:
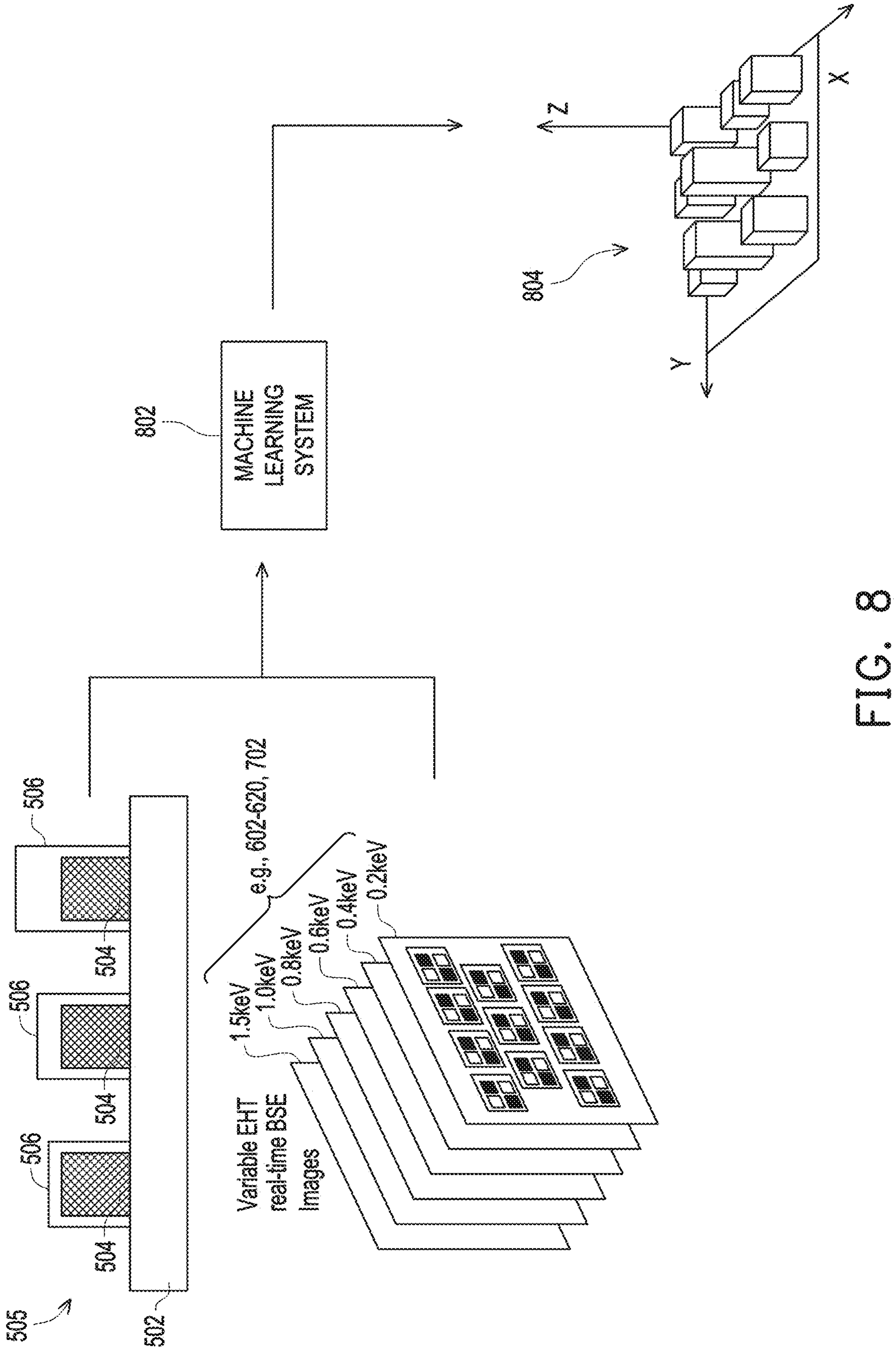
FIG. 8 illustrates a system and process flow for implementing a 3D image algorithm, in accordance with some embodiments.

As previously described, some embodiments include a system and process flow, schematically illustrated in FIG. 8, which provide for implementing a 3D image algorithm (or overlay algorithm) that integrates a machine learning (ML) system 802 (including a trained ML model) with real-time BSE images. In some examples, the ML system 802 may train and use an artificial neural network (e.g., such as a convolutional neural network (CNN or ConvNet)), which defines a mathematical model for modeling complex relationships between inputs and outputs or to find patterns in data. In some embodiments, the ML models, including the CNN, can be trained based on real input image data and/or based on synthetic training data. In an example, the 3D image algorithm disclosed herein may take BSE images (e.g., such as the BSE images 602-620 and 702, described above) of a sample (e.g., such as the samples 505 or 305) as inputs and use the ML system 802 (including the trained ML model) to estimate a surface thickness and sidewall profile to provide a 3D image 804 that can be used for reliable inspection of sample sidewalls, as previously discussed. In various embodiments, the real-time BSE images may be taken across multiple EHT voltages, such as at the various EHT voltages discussed above with reference to FIGS. 6 and 7 (or a subset thereof and/or at different EHT voltages), using the real-time adjustable EHT voltage controller, in order to build up the 3D image 804.

Figure 9:
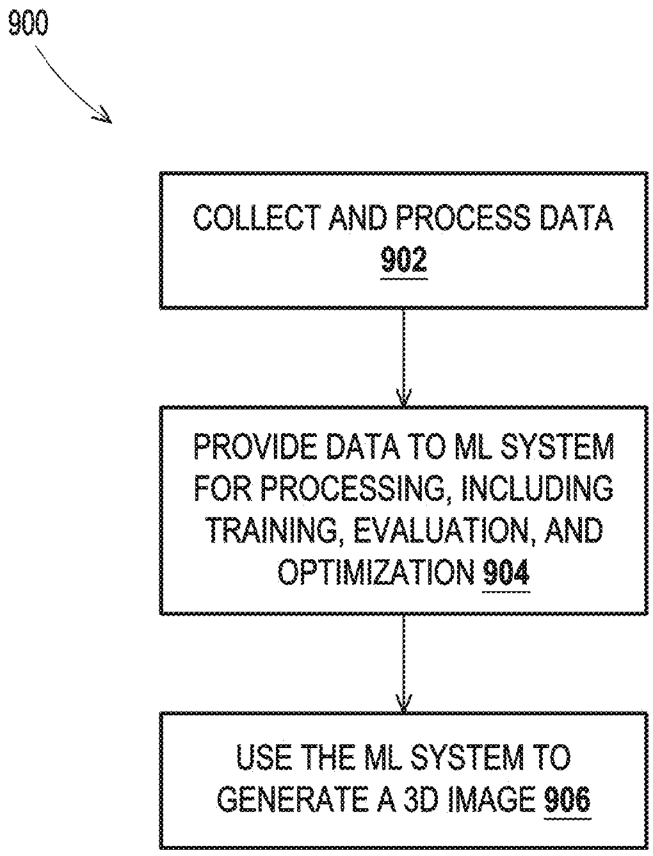
FIG. 9 illustrates a method for implementing the 3D image algorithm of FIG. 8, in accordance with some embodiments.

With reference to FIG. 9, illustrated therein is a method 900 for implementing a 3D image algorithm that may be used to provide the 3D image 804, as described above. It will be understood that the method 900 is merely an example and is not intended to limit the present disclosure to what is explicitly illustrated in the method 900. Further, additional process steps may be implemented before, during, and after the method 900, and some process steps described may be replaced or eliminated in accordance with various embodiments of the method 900.

The method begins at block 902 where data is collected and processed. In some embodiments, the data that is collected includes BSE images captured by the EsB detector 312 (in-lens BSE images) and the wraparound EsB detector assembly 320 (out-lens BSE images). In particular, as discussed above, the out-lens BSE images provided by the wraparound EsB detector assembly 320 include data associated with sample sidewalls (e.g., including sidewall profile and thickness information) and can be used, along with the in-lens BSE images, by the ML system 802 to generate a 3D image (e.g., such as the 3D image 804). In addition, the in-lens and out-lens BSE images may be collected using a plurality of EHT voltages, as described above. The collected data, in various embodiments, may undergo pre-processing that may include filtering, normalization, and segmentation, among others. Thereafter, in some examples, the data can be further processed to extract various features. For instance, the in-lens and out-lens BSE images may be analyzed to determine thicknesses of a non-metal layer (e.g., such as TEOS) on a metal layer (e.g., such as Cr). In various embodiments, the technique used to determine and/or differentiate thicknesses of a non-metal on a metal layer may include one or both of the techniques describe above with reference to FIGS. 6 and 7. That is, in some embodiments, varying grayscale intensities of the BSE images provided by modulating the EHT voltage may be used to differentiate thicknesses of a non-metal on a metal, a Gaussian filter may be used to generate image histograms which can be analyzed to differentiate thicknesses of a non-metal on a metal, or a combination of both techniques may be used. Generally, in some embodiments, features that may be extracted from the data include sidewall profile estimation, surface thickness, intensity, texture, and/or shape features.

The method 900 proceeds to block 904 where data is provided to the ML system 802 for processing. The data provided to the ML system 802 may include in-lens and out-lens BSE images (which may be pre-processed), data related to extracted features (as noted above), and/or other data. In some examples, the data received by the ML system 802 may be split into training and validation sets of data. In some embodiments, the training and validation data may be collected and/or provided to the ML system 802 separately or together. The training data may be used by the ML system 802 to provide the trained ML model, and the validation data may be used to evaluate the trained ML model for accuracy, precision, and recall of predictions. Based on the training and evaluation, and in some embodiments, the ML system 802 may perform an optimization process to fine-tune parameters of the ML model.

The method 900 then proceeds to block 906 where the ML system 802 uses the ML model to generate a 3D image (e.g., such as the 3D image 804) that includes, among other information, surface and sidewall thickness and profile information for a non-metal (e.g., such as TEOS) formed on top and sidewall surfaces of a metal (e.g., such as Cr). The generated 3D image can thus be used for reliable inspection of sample sidewalls, in contrast to at least some existing implementations. In particular, the method 900 provides for effectively locating and identifying defects on a mask, particularly on sidewalls and after a repair has been performed and capped using a TEOS capping layer. Moreover, the method 900 can be used to detect and correct defects in real-time, reducing the need for manual inspection and improving the overall product and process quality. It is also noted that while the method 900 has been discussed in the context of photomask (mask) repair or inspection, in other embodiments, the method 900 may be used in other applications (e.g., such as a mask in-line process monitor, for mask in-line structure verification, for mask OPC design, or for mask CD SEM measurement, or other applications) to achieve similar benefits.

With respect to the description provided herein, disclosed are systems and methods for detecting a thickness and sidewall profile of a target sample. In some embodiments, an SEM with a wraparound out-lens BSE detector is provided. In various embodiments, the out-lens detector includes a plurality of blades (that may have a flat shape or arc shape) strategically positioned at various angles, and which provide for capturing backscattered electrons from a full 360-degree range around the target sample. In various embodiments, an energy filtering grid may also be provided to allow for selection of a specified energy band of BSEs to be detected, thereby providing an EsB detector. The out-lens EsB detector, in some examples, is further optically coupled to a PMT, which may include a high quantum efficiency GaAs photocathode, for electron multiplication and conversion to an electric signal. In some embodiments, a real-time adjustable EHT voltage controller is provided, where variable EHT voltages can be used to generate BSE images with differing grayscale intensities, which in turn can be used to determine a film thickness (or height). Further, various embodiments provide a 3D image algorithm (or overlay algorithm) that integrates a trained ML model with real-time BSE images to estimate a surface thickness and sidewall profile, thereby providing a 3D image that can be used for reliable inspection of sample sidewalls. The embodiments disclosed herein thus provide a variety of benefits and advantages such as higher precision and higher resolution images of a target sample (including a sidewall profile of the target sample), real-time detection and correction of defects (reducing the need for manual inspection and improving the overall quality of the product), and reduced processing time and cost involved in manual inspection and correction, among others.

Thus, one of the embodiments of the present disclosure described a scanning electron microscope (SEM) including an electron gun configured to generate an electron beam that is directed along an axis through a column of the SEM towards a sample stage. In some embodiments, the SEM includes a first backscattered electron (BSE) detector mounted along the axis. In some examples, the SEM further includes a second BSE detector mounted off the axis, where the second BSE detector wraps around a bottom portion of the column.

In another of the embodiments, discussed is a system that includes a sample stage, an electron gun configured to provide an electron beam directed through an electron column towards the sample stage. In some embodiments, the system further includes an in-lens energy selective backscatter (EsB) detector and an out-lens EsB detector that encircles a bottom portion of the electron column. In some examples, the system further includes a computer coupled to receive data from the in-lens EsB detector and the out-lens EsB detector.

In yet another of the embodiments, discussed is a method that includes capturing a plurality of backscattered electron (BSE) images, at a plurality of electron high tension (EHT) voltages, using an in-lens energy selective backscatter (EsB) detector and an out-lens EsB detector. In some embodiments, the out-lens EsB detector encircles a bottom portion of an electron column of an electron microscope. In some examples, the method further includes providing data associated with the plurality of BSE images to a machine learning (ML) system for one or more of training and validation of an ML model. In some embodiments, the method further includes generating, using the ML model, a 3D image of a sample. In various examples, the 3D image includes sidewall thickness and profile information for a non-metal formed on sidewall surfaces of a metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A scanning electron microscope (SEM), comprising:

an electron gun configured to generate an electron beam that is directed along an axis through a column of the SEM towards a sample stage;

a first backscattered electron (BSE) detector mounted along the axis;

a second BSE detector mounted off the axis, wherein the second BSE detector wraps around a bottom portion of the column; and an electron high tension (EHT) voltage controller;

wherein the first BSE detector and the second BSE detector are configured to capture a plurality of BSE images while an EHT voltage of the SEM is adjusted in real-time by the EHT voltage controller.

2. The SEM of claim 1, wherein the second BSE detector wraps around the bottom portion of the column adjacent to a bottom portion of an objective lens of the SEM.

3. The SEM of claim 1, wherein the first BSE detector is configured to detect backscattered electrons that enter the column, and wherein the second BSE detector is configured to detect backscattered electrons that do not enter the column.

4. The SEM of claim 1, wherein the second BSE detector includes a 360-degree wraparound BSE detector.

5. The SEM of claim 1, further comprising:

a first energy filtering grid disposed in front of the first BSE detector to provide a first energy selective BSE detector; and a second energy filtering grid disposed in front of the second BSE detector to provide a second energy selective BSE detector.

6. The SEM of claim 1, further comprising:

one or more photomultiplier tubes coupled to the second BSE detector, wherein the one or more photomultiplier tubes include a GaAs photocathode having GaAs nanowires and microchannel plates composed of GaAs integrated onto a surface of the GaAs photocathode.

7. The SEM of claim 1, wherein the second BSE detector has a plurality of blades having either a flat shape or an arc shape in a side view.

8. The SEM of claim 1, wherein the second BSE detector has a plurality of blades arranged in a circular configuration in a top view.

9. The SEM of claim 8, wherein the circular configuration includes an inner circular portion composed of a first pair of blades of the plurality of blades and an outer circular portion coaxial with the inner circular portion, the outer circular portion composed of a second pair of blades of the plurality of blades.

10. The SEM of claim 8, wherein each blade of the plurality of blades are substantially the same as each other.

11. The SEM of claim 1 configured for communication with an information handling system and configured to provide the plurality of BSE images as inputs to a machine learning system executing on the information handling system to generate a 3D image of a sample.

12. An electron microscope, comprising:

a sample stage;

an electron gun configured to provide an electron beam directed through an electron column along an optical axis towards the sample stage;

a first energy selective backscatter (EsB) detector mounted along the optical axis; and a second EsB detector that encircles a bottom portion of the electron column and is mounted off the optical axis;

wherein the electron microscope is configured to transmit data to a computer from the first EsB detector and the second EsB detector; and wherein the second EsB detector includes a plurality of blades, and wherein a first top surface of a first blade of the plurality of blades is inclined with respect to a second top surface of a second blade of the plurality of blades.

13. The electron microscope of claim 12, wherein the first EsB detector is configured to detect backscattered electrons that enter the electron column, and wherein the second EsB detector is configured to detect backscattered electrons that do not enter the electron column.

14. The electron microscope of claim 12, further comprising:

one or more photomultiplier tubes coupled to the second EsB detector, wherein the one or more photomultiplier tubes include a GaAs photocathode having GaAs nanowires and microchannel plates composed of GaAs integrated onto a surface of the GaAs photocathode.

15. The electron microscope of claim 12, wherein the plurality of blades are arranged in a circular configuration in a top view.

16. The electron microscope of claim 12, wherein the first EsB detector and the second EsB detector are configured to capture a plurality of BSE images at varying electron high tension (EHT) voltages, the plurality of BSE images defining at least part of the data, and wherein the electron microscope is configured to transmit the data to a machine learning system executing on the computer for generation of a 3D image of a sample disposed on the sample stage.

17. An electron microscope, comprising:

an electron emitter configured to generate an electron beam that is directed along an optical axis through a column of the electron microscope towards a stage;

a first detector mounted along the optical axis, wherein the first detector is configured to detect backscattered electrons that enter the column;

a second detector mounted off the optical axis and wrapping around a bottom portion of the column, wherein the second detector is configured to detect backscattered electrons that do not enter the column; and a plurality of photomultiplier tubes coupled to the second detector, wherein the plurality of photomultiplier tubes include a GaAs photocathode having GaAs nanowires and microchannel plates composed of GaAs integrated onto a surface of the GaAs photocathode.

18. The electron microscope of claim 17, further comprising:

a first energy filtering grid disposed in front of the first detector to provide a first energy selective detector; and a second energy filtering grid disposed in front of the second detector to provide a second energy selective detector.

19. The electron microscope of claim 17, further comprising:

an electron high tension (EHT) voltage controller;

wherein the first detector and the second detector are configured to capture a plurality of images while an EHT voltage of the electron microscope is adjusted in real-time by the EHT voltage controller.

20. The electron microscope of claim 19 configured for communication with an information handling system and configured to provide the plurality of images as inputs to a machine learning system executing on the information handling system to generate a 3D image of a sample.

* * * * *